(12) United States Patent
Hasegawa et al.

(10) Patent No.: US 11,587,869 B2
(45) Date of Patent: Feb. 21, 2023

(54) SEMICONDUCTOR DEVICE AND METHOD OF MANUFACTURING THE SAME

(71) Applicant: ABLIC Inc., Tokyo (JP)

(72) Inventors: Hisashi Hasegawa, Tokyo (JP); Takeshi Koyama, Tokyo (JP); Shinjiro Kato, Tokyo (JP); Kohei Kawabata, Tokyo (JP)

(73) Assignee: ABLIC INC., Tokyo (JP)

( * ) Notice: Subject to any disclaimer, the term of this patent is extended or adjusted under 35 U.S.C. 154(b) by 162 days.

(21) Appl. No.: 17/082,971

(22) Filed: Oct. 28, 2020

(65) Prior Publication Data

US 2021/0134714 A1 May 6, 2021

(30) Foreign Application Priority Data

Oct. 31, 2019 (JP) .............................. JP2019-198257
Sep. 1, 2020 (JP) .............................. JP2020-146508

(51) Int. Cl.
*H01L 23/528* (2006.01)
*H01L 23/532* (2006.01)
*H01L 27/088* (2006.01)

(52) U.S. Cl.
CPC ........ *H01L 23/528* (2013.01); *H01L 27/0883* (2013.01); *H01L 23/53219* (2013.01)

(58) Field of Classification Search
CPC ............... H01L 23/528; H01L 27/0883; H01L 23/53219; H01L 21/823462; H01L 21/823475; H01L 23/3157; H01L 29/0642; H01L 29/66553; H01L 29/7838; H03L 1/00; H03L 5/00
See application file for complete search history.

(56) References Cited

U.S. PATENT DOCUMENTS

| | | | | |
|---|---|---|---|---|
| 2005/0064637 A1* | 3/2005 | Yeh | ..................... | H01L 29/6659 438/585 |
| 2006/0244025 A1* | 11/2006 | Yamanobe | ........ | H01L 27/11502 257/296 |
| 2008/0191252 A1* | 8/2008 | Nakamura | ........ | H01L 27/11507 257/295 |
| 2009/0189668 A1* | 7/2009 | Morino | ................ | H03K 17/223 327/306 |

FOREIGN PATENT DOCUMENTS

| | | | |
|---|---|---|---|
| JP | 2003-152100 A | 5/2003 | |
| JP | 1310998 | * 5/2003 | ............. H01L 27/06 |

* cited by examiner

Primary Examiner — Galina G Yushina
(74) Attorney, Agent, or Firm — Crowell & Moring LLP

(57) ABSTRACT

A semiconductor device includes a semiconductor substrate, a field-effect transistor arranged at least partially on the semiconductor substrate and used in an analog circuit, and having a P-type gate electrode, an interlayer insulating film arranged on the field-effect transistor, and a hydrogen shielding metal or metallic film arranged on the interlayer insulting film and covering the P-type gate electrode and configured to shield hydrogen.

20 Claims, 6 Drawing Sheets

SEMICONDUCTOR DEVICE AND METHOD OF MANUFACTURING THE SAME

RELATED APPLICATIONS

This application claims priority to JP Application No. 2019-198257, filed on Oct. 31, 2019 and JP Application No. 2020-146508 filed Sep. 1, 2020, the entire contents of which are incorporated herein by reference.

BACKGROUND OF THE INVENTION

1. Field of the Invention

The present invention relates to a semiconductor device and a method of manufacturing the same.

2. Description of the Related Art

Of semiconductor devices each having fine elements formed on a semiconductor substrate such as silicon, there has been known a semiconductor device for analog application in which semiconductor elements such as a MISFET (Metal-Insulator-Semiconductor Field-Effect Transistor), a resistive element, a fuse element, etc., are combined.

The semiconductor device for analog application includes, for example, a voltage regulator, a voltage detector, a switching regulator. In these semiconductor devices for analog application, some have been developed to have a capability for a long time operation driven by a secondary battery or the like at low voltage and low current consumption along the development of a wearable device and an IoT (Internet of the Things). In the case where a power management IC such as a voltage regulator is provided with a reference voltage generating circuit, a reduction in variation of a reference voltage and its long-term stability are becoming important.

In the MISFET used in such a reference voltage generating circuit, hydrogen generated from a passivation film or the like is bonded to a dangling bond existing in the interface between a gate oxide film and a silicon substrate, so that a threshold voltage may vary in manufacturing or change with time.

With the foregoing in view, there has been proposed a semiconductor device in which a hydrogen shielding silicon nitride film is formed on an N channel MOS transistor to prevent hydrogen from being diffused into the N channel MOS transistor (refer to, for example, Japanese Patent Application Laid-Open No. 2003-152100).

SUMMARY OF THE INVENTION

In one aspect of the present invention, it is an object of the present invention to provide a semiconductor device capable of suppressing the occurrence of a malfunction due to hydrogen without increasing films to be formed.

A semiconductor device according to one aspect of the present invention includes: a semiconductor substrate; a field-effect transistor arranged on the semiconductor substrate and used in an analog circuit, and having a P-type gate electrode; an interlayer insulating film arranged on the field-effect transistor; and a hydrogen shielding metal or metallic film arranged on the interlayer insulating film and covering the P-type gate electrode and configured to shield hydrogen.

According to one aspect of the present invention, there can be provided a semiconductor device capable of suppressing the occurrence of a malfunction due to hydrogen without increasing films to be formed.

DETAILED DESCRIPTION OF THE PREFERRED EMBODIMENTS

Figure 1:
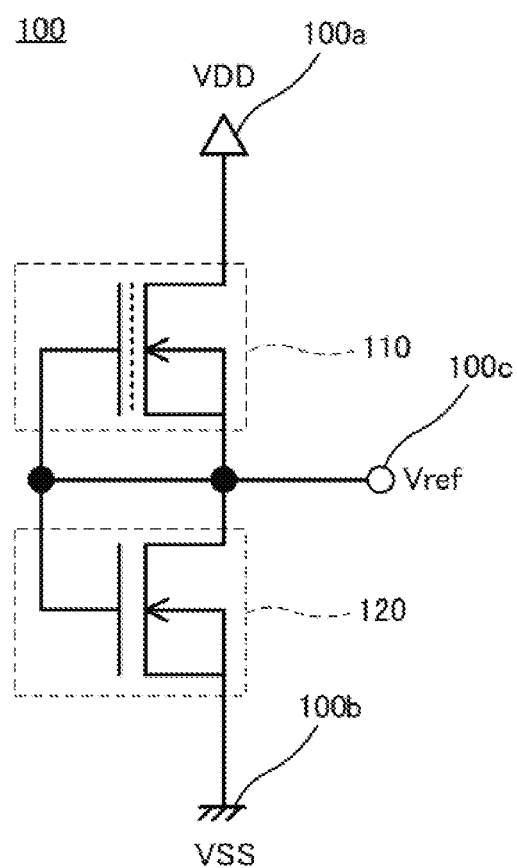
FIG. 1 is a circuit diagram illustrating an analog circuit of a semiconductor device according to a first embodiment of the present invention.

A semiconductor device according to one embodiment of the present invention includes a semiconductor substrate, a field-effect transistor which is arranged on the semiconductor substrate and used in an analog circuit, and has a P-type gate electrode, an interlayer insulating film arranged on the field-effect transistor, and a hydrogen shielding metal or metallic film which is arranged on the interlayer insulating film and covering the P-type gate electrode and shields hydrogen.

The semiconductor device according to the one embodiment of the present invention is based on the following findings.

Features required for a semiconductor device for analog application are much different from those of a semiconductor device for logic which deals with binary signals. For example, in a charge-discharge control circuit of a secondary battery such as a lithium-ion battery, specifications of μV-unit have often been required in the last few years to reduce the discharging of the secondary battery used in a mobile device or the like as much as possible. Reliability of μV-unit has been required for a reference voltage generating circuit used in the charge-discharge control circuit. For this reason, it is necessary to reduce variations in threshold voltage of a field-effect transistor (hereinafter called a "MOS transistor") included in the reference voltage generating circuit, and its temporal changes which can be indicated in a long-term reliability test.

Upon forming this MOS transistor, an impurity such as boron, phosphorus, and arsenic is often implanted in a polysilicon film to form a gate electrode. The boron implanted as an impurity is easy to diffuse into the polysilicon film as compared with the phosphorus and arsenic and diffuses into the gate oxide film below the polysilicon film. Then, it is considered that the film quality of the gate oxide film tends to deteriorate more easily than in the case where the phosphorus or arsenic is implanted, and tends to permit passing-through of a small atom like hydrogen. At this time, bonding of even a small amount of hydrogen generated from a passivation film to a dangling bond existing in an interface between the gate oxide film and a silicon substrate may result in, in the semiconductor device for analog application requiring adjustments in μV units, dispersion of a threshold voltage in manufacturing and changing with time.

With this point of view, although in the semiconductor device described in Japanese Patent Application Laid-Open No. 2003-152100, the silicon nitride film for hydrogen shielding is arranged on the P-type gate electrode, not only a process for forming the silicon nitride film increases, but the threshold voltage may change due to the stress of the silicon nitride film arranged in the vicinity of the P-type gate electrode.

With the foregoing in view, in the semiconductor device according to the one embodiment of the present invention, a metal wiring layer arranged on the MOS transistor is expanded in area and used as the hydrogen shielding metal or metallic film. That is, since the hydrogen generated from the passivation film or the like can be shielded with the arrangement of the hydrogen shielding metal or metallic film serving as the metal wiring layer covering the P-type gate electrode easy to change in threshold voltage, the semiconductor device is capable of suppressing the occurrence of a malfunction due to hydrogen without increasing films to be formed.

As an example of the semiconductor device according to the one embodiment of the present invention, an embodiment in which an analog circuit is constituted as an ED type reference voltage generating circuit will next be described with reference to the accompanying drawings.

Note that the drawings are schematic, and the relationship between the film thickness and the plane dimension, the ratio of each film thickness, etc., are not as illustrated in the drawings. Also, in the semiconductor substrate, the surface on the side where other films and layers are laminated using a semiconductor manufacturing process is called an "upper surface", and the surface on the side opposite to the upper surface is called a "lower surface". Further, in the following, the number, positions, forms, structures, and sizes of a plurality of films or semiconductor elements obtained by structurally combining these films are not limited to those in embodiments illustrated below. They can be set to the number, position, form, structure, size, etc., suitable for implementing the present invention.

First Embodiment

FIG. 1 is a circuit diagram illustrating an analog circuit of a semiconductor device according to a first embodiment of the present invention. As illustrated in FIG. 1, the semiconductor device 100 according to the present embodiment includes an ED type reference voltage generating circuit which is the analog circuit and has a depletion type N channel field-effect transistor 110 and an enhancement type N channel field-effect transistor 120.

Incidentally, in the following, the "depletion type N channel field-effect transistor" may be called a "D-type NMOS transistor", and the "enhancement type N channel field-effect transistor" may be called an "E-type NMOS transistor".

The D-type NMOS transistor 110 functions as a constant current source which supplies a constant current independent of a power supply voltage VDD from its source to the E-type NMOS transistor 120 upon application of the power supply voltage VDD to its drain connected to a power supply terminal 100a. The E-type NMOS transistor 120 causes a reference voltage $V_{ref}$ to be generated at a reference voltage terminal 100c based on the constant current supplied from the D-type NMOS transistor 110. In this manner, the ED type reference voltage generating circuit is formed by combining the D-type NMOS transistor 110 and the E-type NMOS transistor 120.

A gate of the D-type NMOS transistor 110, a backgate thereof, the reference voltage terminal 100c, and a gate and drain of the E-type NMOS transistor 120 are connected to the source of the D-type NMOS transistor 110. They are kept equal in potential to each other. Further, a back gate of the E-type NMOS transistor 120 and a ground terminal 100b are connected to the source of the E-type NMOS transistor 120. They are kept equal in potential to each other.

A drain current $I_{d1}$ of the D-type NMOS transistor 110 is determined here. In this case, assuming that mutual conductance in its non-saturated or saturated operation is gmD, the drain current $I_{d1}$ can be represented as illustrated in the following equation (1). Incidentally, since the gate and source of the D-type NMOS transistor 110 are connected to each other as described above, a gate-source voltage $V_{g1}$ becomes 0V in the following equation (1). For this reason, the drain current $I_{d1}$ being an output current of the D-type NMOS transistor 110 depends on a threshold voltage $V_{td}$.

$$I_{d1} = \tfrac{1}{2} \cdot gmD \cdot (V_{g1} - V_{td})^2 = \tfrac{1}{2} \cdot gmD \cdot (|V_{td}|)^2 \tag{1}$$

Next, a drain current $I_{d2}$ of the E-type NMOS transistor 120 is determined. In this case, assuming that mutual conductance in its saturated operation is gmE, the drain current $I_{d2}$ can be represented as illustrated in the following equation (2). Incidentally, since the gate and drain of the E-type NMOS transistor 120 are connected to each other, and further these and the reference voltage terminal 100c are connected, as described above, a gate-source voltage $V_{g2}$ becomes the reference voltage $V_{ref}$ in the following equation (2). For this reason, the drain current $I_{d2}$ depends on a threshold voltage $V_{te}$ and the reference voltage $V_{ref}$.

$$I_{d2} = \tfrac{1}{2} \cdot gmE \cdot (V_{g2} - V_{te})^2 = \tfrac{1}{2} \cdot gmE \cdot (V_{ref} - V_{te})^2 \tag{2}$$

From the above, since $I_{d1}$ of the above equation (1) becomes equal to $I_{d2}$ of the above equation (2), the reference voltage $V_{ref}$ is represented as in the following equation (3):

$$V_{ref} \cong V_{te} + (gmD/gmE)^{1/2} \cdot |V_{td}| \tag{3}$$

Figure 2:
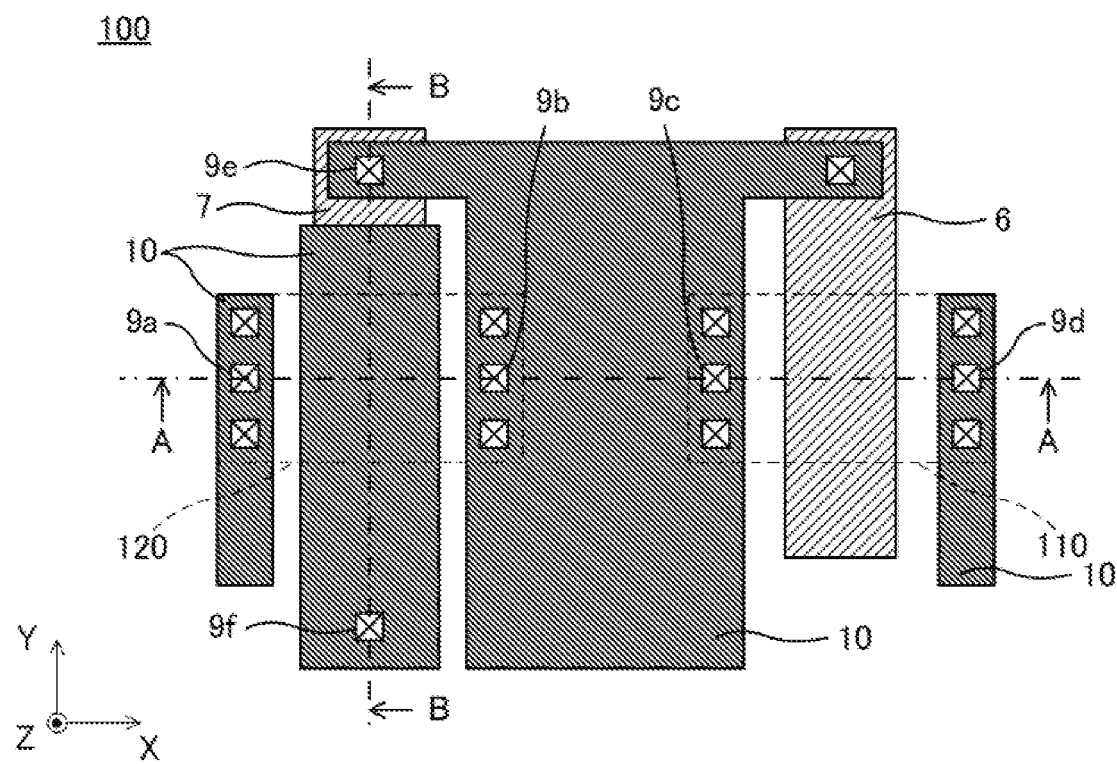
FIG. 2 is a schematic plan view illustrating the semiconductor device according to the first embodiment of the present invention.

FIG. 2 is a schematic plan view illustrating the semiconductor device according to the first embodiment of the present invention and is a diagram of the ED type reference voltage generating circuit formed on the semiconductor substrate as seen in plan view. In FIG. 2, there are illustrated an N-type gate electrode 6, a P-type gate electrode 7, a hydrogen shielding metal or metallic film 10 serving as a metal wiring layer, and metal wirings 9a to 9f connected to the hydrogen shielding metal or metallic film 10 in the structure of the semiconductor device 100. Further, broken lines in FIG. 2 respectively indicate active regions of the D-type NMOS transistor 110 and the E-type NMOS transistor 120.

Incidentally, the diagram seen in plan view means a diagram (top view) as the upper surface of the semiconductor substrate is viewed from its normal direction.

As seen in plan view from above the semiconductor substrate, the hydrogen shielding metal or metallic film 10 on the active region indicated by the broken line on the E-type NMOS transistor 120 side is arranged to be wider in area than the P-type gate electrode 7 and to cover the P-type gate electrode 7.

Here, the cross sections of the D-type NMOS transistor 110 and the E-type NMOS transistor 120 will be described with reference to FIGS. 3 and 4.

Figure 3:
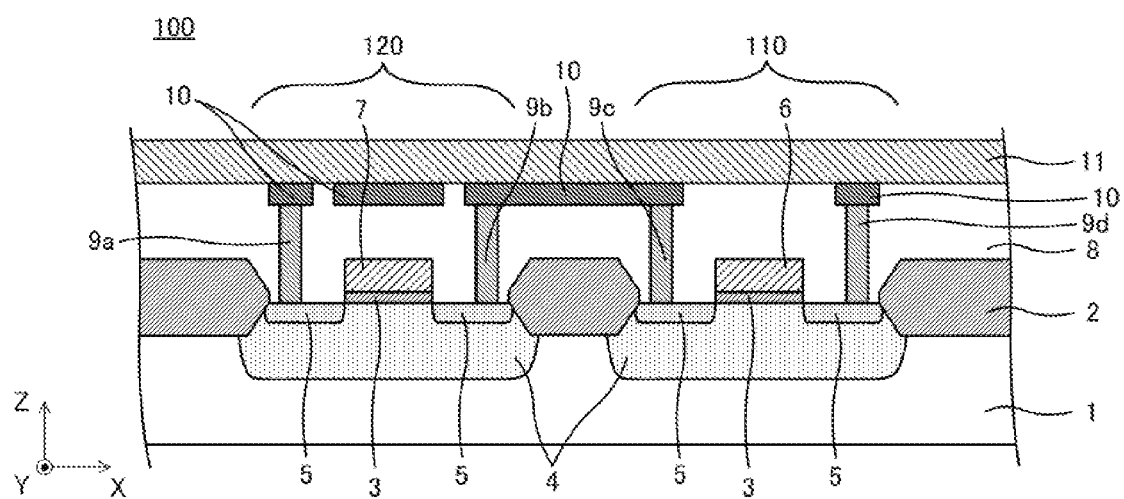
FIG. 3 is an explanatory diagram illustrating a cross section taken along line A-A in FIG. 2.

FIG. 3 is an explanatory diagram illustrating a cross section taken along line A-A in FIG. 2. FIG. 4 is an explanatory diagram illustrating a cross section taken along line B-B in FIG. 2.

Figure 4:
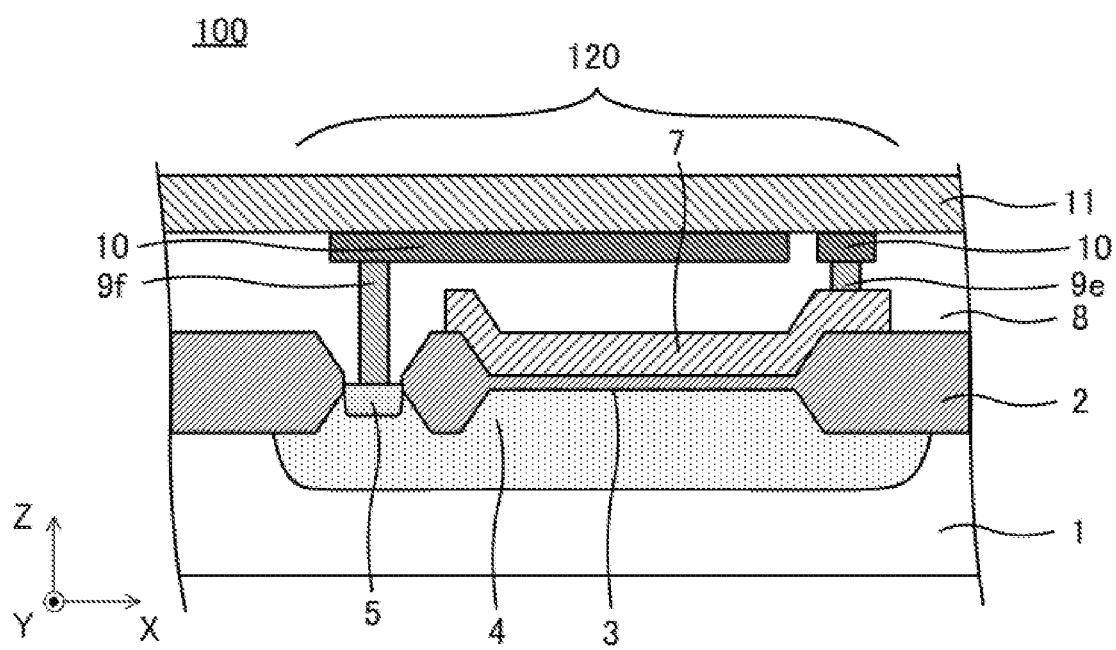
FIG. 4 is an explanatory diagram illustrating a cross section taken along line B-B in FIG. 2.

As illustrated in FIGS. 3 and 4, the semiconductor device includes a semiconductor substrate 1, an isolating oxide film 2, a gate oxide film 3, a P-type well region 4, a source-drain region 5, an N-type gate electrode 6, a P-type gate electrode 7, a silicon oxide film (hereinafter called "BPSG (Boro-Phospho Silicate Glass) film") 8 added with phosphorus and boron, a metal wiring 9, a hydrogen shielding metal or metallic film 10, and a passivation film 11. The D-type NMOS transistor 110 and the E-type NMOS transistor 120 are formed by structurally combining the isolating oxide film 2, the gate oxide film 3, the P-type well region 4, the source-drain region 5, the N-type gate electrode 6, and the P-type gate electrode 7 on the semiconductor substrate 1.

The semiconductor substrate 1 is a wafer-like P-type silicon semiconductor substrate.

Incidentally, in the present embodiment, the wafer-like P-type silicon semiconductor substrate is constituted as the semiconductor substrate 1, but not limited to it. The shape, structure, size, material, and polarity of the semiconductor substrate 1 can be appropriately selected according to the purpose.

The isolating oxide film 2 is LOCOS (LOCal Oxidation of Silicon) formed on the semiconductor substrate 1. The isolating oxide film 2 is provided at the outer edge of each active region to isolate the D-type NMOS transistor 110 and the E-type NMOS transistor 120 from each other.

Incidentally, in the present embodiment, the LOCOS is formed to isolate the D-type NMOS transistor 110 and the E-type NMOS transistor 120 from each other, but not limited to it. For example, STI (Shallow Trench Isolation) or the like may be formed to perform their isolation.

The D-type NMOS transistor 110 has the gate oxide film 3, P-type well region 4, source-drain region 5, and N-type gate electrode 6 with phosphorus implanted in a polysilicon film.

In the D-type NMOS transistor 110, an impurity concentration thereof is adjusted such that the difference in work function between the P-type well region 4 and the N-type gate electrode 6 becomes large. From this point of view, a low threshold voltage is reached because an electric field in a reverse direction is applied to the surface of the P-type semiconductor substrate 1. Further, since the threshold voltage can be made low by an N-type channel doped region, the implantation of an impurity into the N-type gate electrode 6 and the channel doped region is appropriately controlled such that the D-type NMOS transistor 110 becomes a depletion type, and the threshold voltage $V_{td}$ can be made 0V or below. With this, a drain current can be made to flow through the channel by applying a drain voltage even if the potential of the gate is 0V.

Further, the backgate of the D-type NMOS transistor 110 is connected to the P-type well region 4 through a region (not illustrated) including a high concentration P-type impurity and connected to its source.

The E-type NMOS transistor 120 has a P-type gate electrode 7 formed by implanting $BF_2$. The impurity concentrations of the P-type gate electrode 7 and the channel doped region are adjusted such that the threshold voltage $V_{te}$ becomes 0V or more. Further, the hydrogen shielding metal or metallic film 10 is arranged above the P-type gate electrode 7. The E-type NMOS transistor 120 is similar to the D-type NMOS transistor 110 except for these.

Incidentally, the form, structure, size, and material of the P-type gate electrode 7, and the kind and concentration of the impurity are not limited in particular, and can be appropriately selected according to the purpose.

The BPSG film 8 as an interlayer insulating film is formed at the upper surfaces of the D-type NMOS transistor 110 and the E-type NMOS transistor 120 with its surface planarized. In the BPSG film 8, metal wirings 9a to 9d are respectively embedded in contact holes respectively formed to penetrate to the source-drain region 5, and a conduction path from the source-drain region 5 is formed.

Incidentally, in the present embodiment, the interlayer insulating film is constituted as the BPSG 8, but not limited to it. For example, the interlay insulating film may be constituted as a layered structure of an NSG (None-doped Silicate Glass) film and a BPSG film, a layered structure of a TEOS (Tetra-Ethyl-Ortho-Silicate) film and a BPSG film, etc.

The hydrogen shielding metal or metallic film 10 electrically connected to the upper portions of the metal wirings 9a to 9d is formed of AlSiCu. Since the hydrogen shielding metal or metallic film 10 exists above the P-type gate electrode 7, the hydrogen shielding metal or metallic film 10 can inhibit the transfer of hydrogen with the passivation film 11 or the like as its generation source from above and shield hydrogen to prevent it from entering the neighborhood of the E-type NMOS transistor 120 having the P-type gate electrode 7. That is, since the hydrogen shielding metal or metallic film 10 also functioning as a metal wiring layer exists above the P-type gate electrode 7, the semiconductor device 100 according to the present embodiment is capable of suppressing the occurrence of a malfunction due to hydrogen without increasing films to be formed.

The material of the hydrogen shielding metal or metallic film 10 is not limited in particular and can be appropriately selected according to the purpose. However, the material is preferably an aluminum alloy in terms of the hydrogen shielding metal or metallic film 10 serving as the metal wiring layer. The aluminum alloy may include, for example, AlNd, AlCu, AlSi, etc., in addition to AlSiCu. Further, there may be a form of forming tungsten on underlying titanium in a film manner. The form of forming tungsten on the underlying titanium in the film manner is advantageous in that tungsten prevents the entry of hydrogen and hydrogen can be absorbed by the underlying titanium.

Incidentally, in the present embodiment, the hydrogen shielding metal or metallic film 10 is made wider in area than the active region of the P-type gate electrode 7, but is not limited thereto in the case where it is possible to shield hydrogen diffused into the active region of the P-type gate electrode 7. The area of the hydrogen shielding metal or metallic film 10 may be equal to or narrower than that of the active region of the P-type gate electrode 7.

The thickness of the hydrogen shielding metal or metallic film 10 is not limited in particular and can be appropriately selected according to the purpose. The thickness is, however, preferably 300 nm or more and 500 nm or less from the viewpoint that it is possible to ensure a thickness with which hydrogen can be shielded.

The size of the hydrogen shielding metal or metallic film 10 is not limited in particular and can be appropriately selected according to the purpose. However, in the active region, the size of the hydrogen shielding metal or metallic film 10 is preferably larger than that of the P-type gate electrode 7 as seen in plan view.

The passivation film 11 is provided at the uppermost surface of the semiconductor device 100.

The passivation film 11 is preferably a silicon nitride film. As a method for forming the silicon nitride film, plasma CVD is preferably used because the metal wirings 9a to 9d may be melted in the case where low pressure CVD (Chemical Vaper Deposition) is used.

Incidentally, in the present embodiment, the passivation film 11 is constituted as the signal layer structure of the silicon nitride film, but not limited thereto. For example, the passivation film 11 may be a two-layer structure of a silicon oxide film and a silicon nitride film. Further, the form, structure, and size of the passivation film 11 are not limited in particular and can be appropriately selected according to the purpose.

In this manner, the semiconductor device 100 according to the present embodiment includes, on the semiconductor substrate 1, the E-type NMOS transistor 120 used in the ED type reference voltage generating circuit and having the P-type gate electrode 7, the BPSG film 8 arranged on the E-type NMOS transistor 120, and the hydrogen shielding metal or metallic film 10 which is arranged on the BPSG film 8 and covering the P-type gate electrode 7 and shields hydrogen. With this configuration, the semiconductor device 100 is capable of suppressing the occurrence of a malfunction due to hydrogen without increasing films to be formed.

Figure 5A:
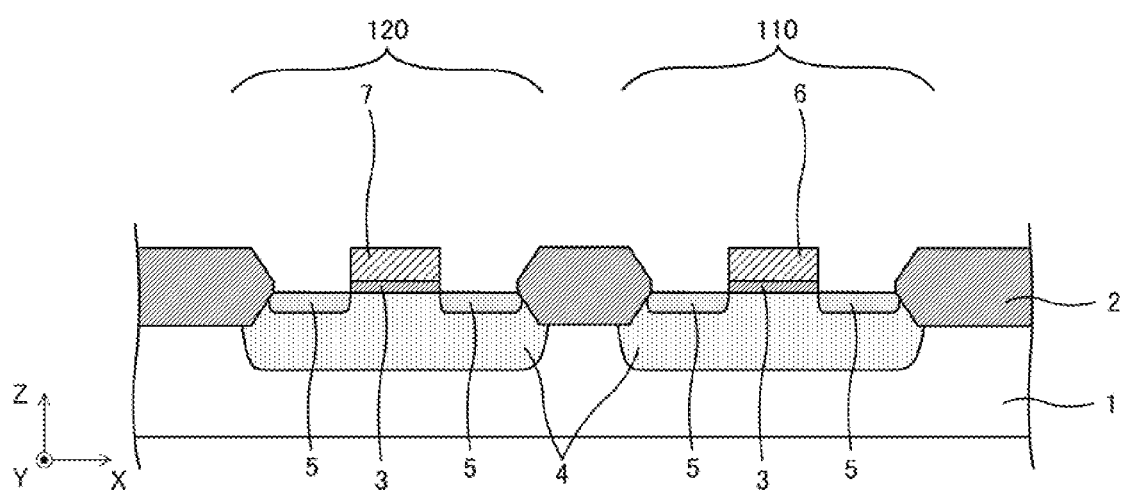
FIG. 5A is an explanatory diagram illustrating a method for manufacturing the semiconductor device according to the first embodiment of the present invention.

A method for manufacturing the semiconductor device 100 according to the present embodiment will next be described with reference to FIGS. 5A to 5C.

First, a semiconductor substrate 1 is prepared, and LOCOS forming processing is performed thereon to form an isolating oxide film 2 on the semiconductor substrate 1. Next, as illustrated in FIG. 5A, a gate oxide film 3, a P-type well region 4, a source-drain region 5, an N-type gate electrode 6, and a P-type gate electrode 7 are formed on the semiconductor substrate 1 by related art MOSFET manufacturing techniques such as gate oxide film forming processing, source-drain region forming processing, gate electrode forming processing by polysilicon, etc. With this, a D-type NMOS transistor 110 and an E-type NMOS transistor 120 are formed.

Specifically, in order to form the D-type NMOS transistor 110, boron is first implanted in a part of each active region to form the P-type well region 4 and form an N-type channel doped region in a part of the surface of the P-type well region 4. Next, after the gate oxide film 3 is formed on the channel doped region, phosphorus having a low concentration above $5 \times 10^{16}$ and below $1 \times 10^{18}/cm^3$ is implanted in a polysilicon film formed on the gate oxide film 3 to form the N-type gate electrode 6. Then, the N-type source-drain region 5 having a high concentration of $1 \times 10^{19}/cm^3$ or more is formed in the surface of the P-type well region 4 at a position to interpose the channel doped region below the gate oxide film 3.

Incidentally, these are formed by performing photomask processing on required portions.

Further, the thickness of the polysilicon film is not limited in particular and can be appropriately selected according to the purpose, but is preferably 100 nm or more and 500 nm or less.

Figure 5B:
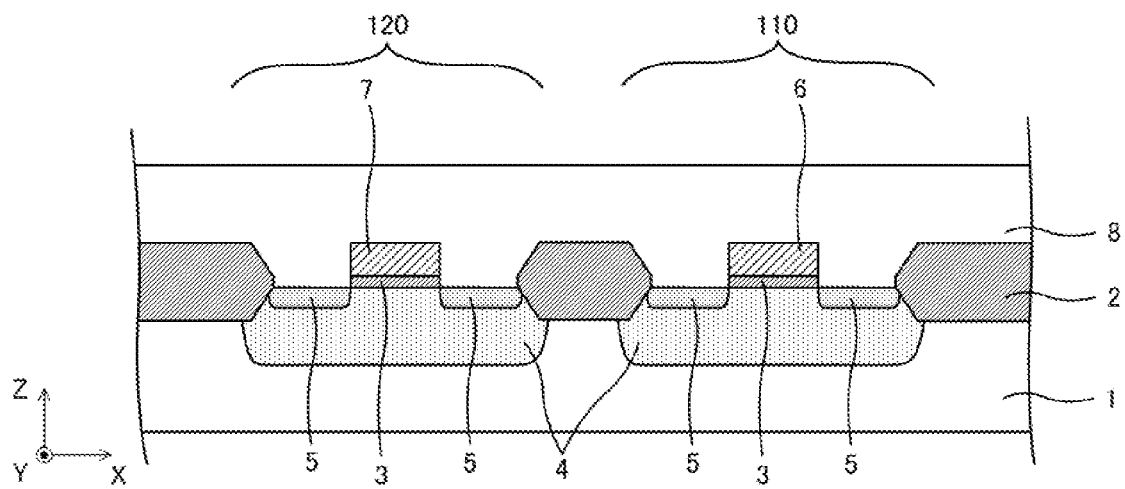
FIG. 5B is an explanatory diagram illustrating the method for manufacturing the semiconductor device according to the first embodiment of the present invention.
Figure 5C:
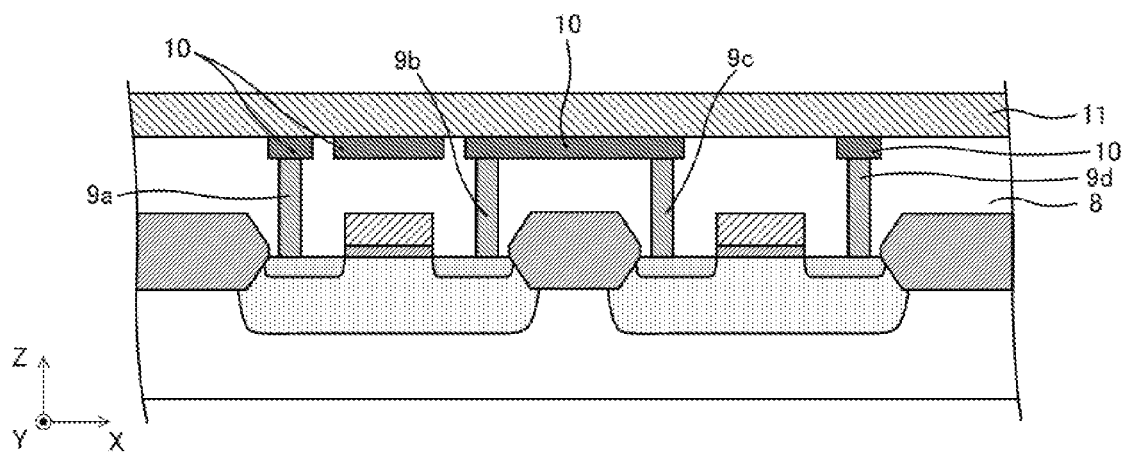
FIG. 5C is an explanatory diagram illustrating the method for manufacturing the semiconductor device according to the first embodiment of the present invention.

Next, as illustrated in FIG. 5B, a BPSG film 8 is formed over the entire surface region and planarized.

A method for forming the BPSG film 8 is not limited in particular and can be appropriately selected according to the purpose.

A method for planarizing the BPSG film 8 is not limited in particular and can be appropriately selected according to the purpose. The method however includes, for example, a reflow method, an etchback method, a CMP (Chemical Mechanical Polishing) method, etc. In the reflow method, specifically, an oxide film containing phosphorus or boron is formed and then may be planarized with heat treatment of 850° C. or higher.

Next, contact holes are opened in the BPSG film 8 by photolithography and dry etching, and tungsten is embedded therein with titanium as a base to form metal wirings 9a to 9d. Then, a hydrogen shielding metal or metallic film 10 is formed by photolithography and etching. Since the hydrogen shielding metal or metallic film 10 also serves as a metal wiring layer, there exist portions electrically connected to upper portions of the metal wirings 9a to 9d.

Next, after the BPSG film 8 is formed and planarized, a passivation film 11 being a silicon nitride film is formed on the BPSG film 8 and the hydrogen shielding metal or metallic film 10 by the plasma CVD.

In this manner, the method of manufacturing the semiconductor device 100 according to the present embodiment includes a step of forming the E-type NMOS transistor 120 which is arranged on the semiconductor substrate 1 and used in the ED type reference voltage generating circuit and having the P-type gate electrode 7, a step of forming the BPSG film 8 on the E-type NMOS transistor 120, and a step of forming the hydrogen shielding metal or metallic film 10 shielding hydrogen on the BPSG film 8 and covering the P-type gate electrode 7. With this view, the manufactured semiconductor device 100 is capable of suppressing the occurrence of a malfunction due to hydrogen without increasing films to be formed.

Figure 6:
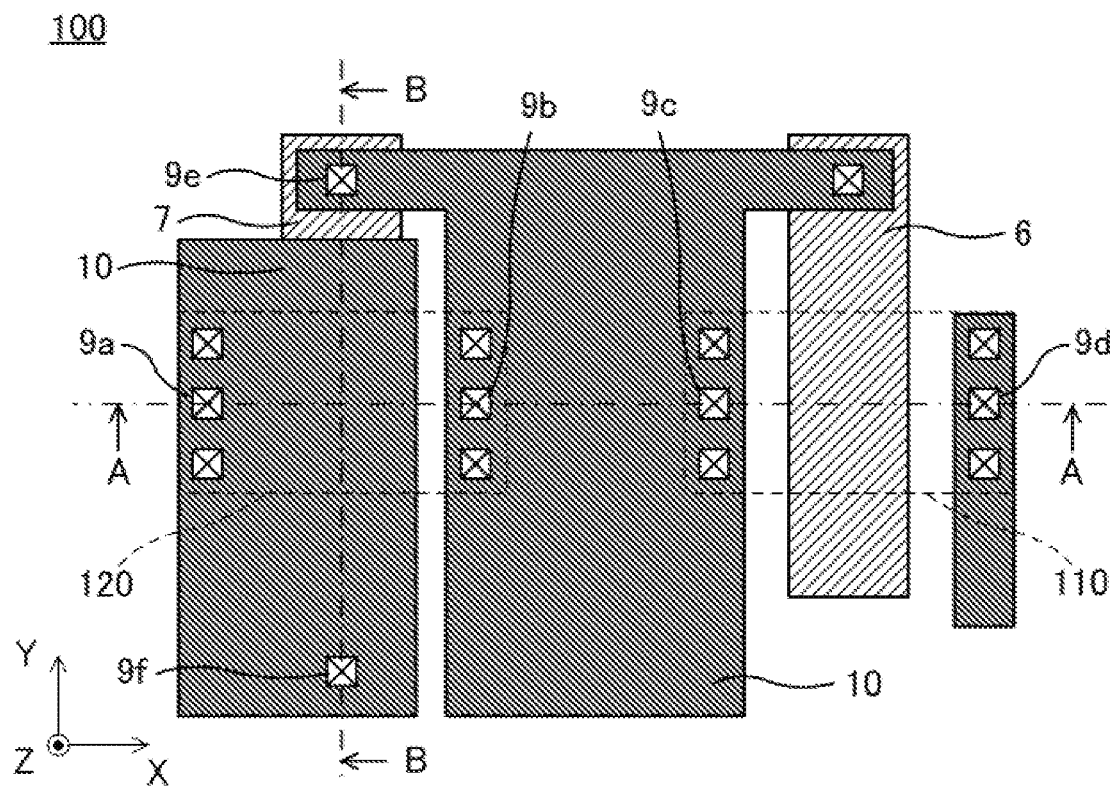
FIG. 6 is a schematic plan view illustrating a modification of the first embodiment of the present invention.

Incidentally, in the present embodiment, as illustrated in FIG. 6, a source terminal of the E-type NMOS transistor 120 and the hydrogen shielding metal or metallic film 10 may be integrated. With this, since the area of the hydrogen shielding metal or metallic film 10 can be made wide, and no gap exists between the source terminal and the hydrogen shielding metal or metallic film 10, hydrogen is preferably made hard to be diffused into the E-type NMOS transistor 120 having the P-type gate electrode 7.

Second Embodiment

Figure 7:
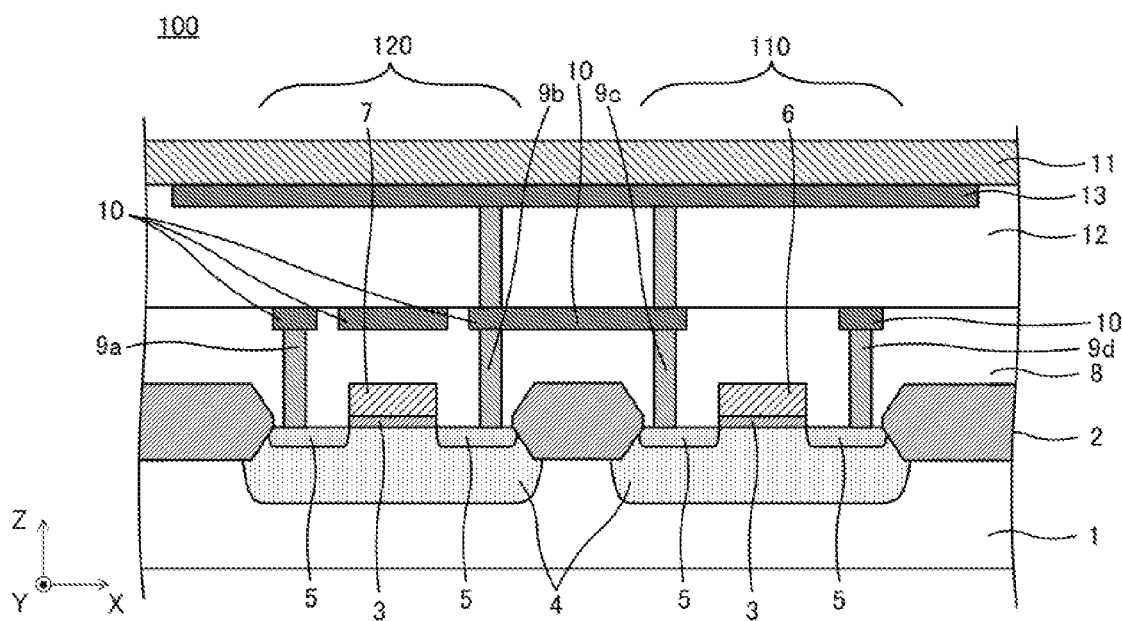
FIG. 7 is an explanatory diagram illustrating a cross section of a semiconductor device according to a second embodiment of the present invention.

FIG. 7 is an explanatory diagram illustrating a cross section of a semiconductor device according to a second embodiment of the present invention. In the second embodiment as illustrated in FIG. 7, a wide region hydrogen shielding metal or metallic film 13 is arranged on the hydrogen shielding metal or metallic film 10 through a BPSG film 12 in addition to the first embodiment illustrated in FIG. 3.

The wide region hydrogen shielding metal or metallic film 13 is formed of AlSiCu in a manner similar to the hydrogen shielding metal or metallic film 10. Since the wide region hydrogen shielding metal or metallic film 13 exists above the P-type gate electrode 7 and the hydrogen shielding metal or metallic film 10, the intrusion of hydrogen into the E-type NMOS transistor 120 having the P-type gate electrode 7 can be shielded by the wide region hydrogen shielding metal or metallic film 13 in addition to the hydrogen shielding metal or metallic film 10, thereby making it possible to further suppress the occurrence of a malfunction due to hydrogen.

Further, in the case where the semiconductor device 100 according to the present embodiment has a plurality of field-effect transistors, the wide region hydrogen shielding metal or metallic film 13 is preferably arranged above the hydrogen shielding metal or metallic film 10 so as to cover the entire field-effect transistors.

Third Embodiment

Figure 8:
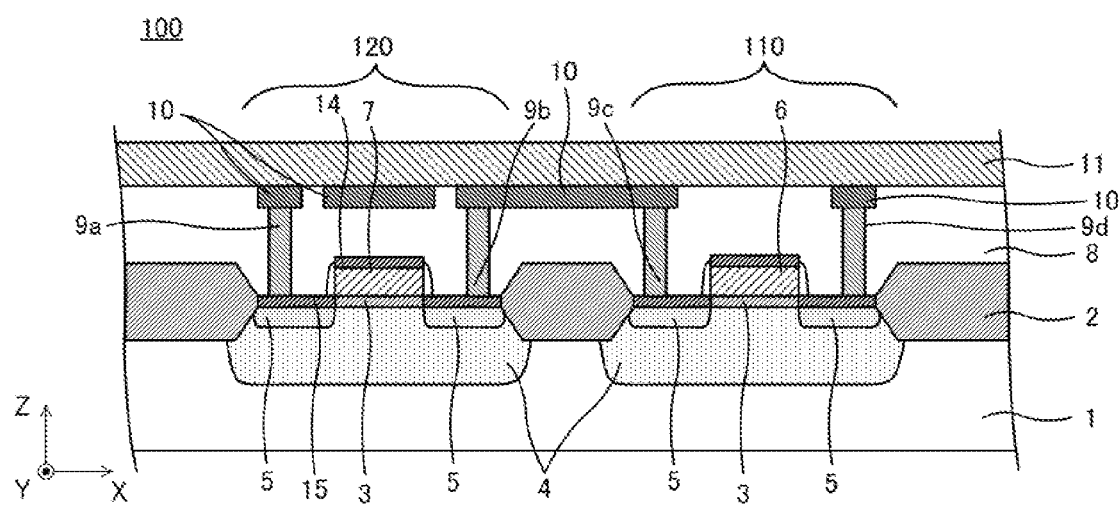
FIG. 8 is an explanatory diagram illustrating a cross section of a semiconductor device according to a third embodiment of the present invention.

FIG. 8 is an explanatory diagram illustrating a cross section of a semiconductor device according to a third embodiment of the present invention.

As illustrated in FIG. 8, in the third embodiment, metal silicide films 14 and 15 of CoSi are formed at the upper portions of the P-type gate electrode 7 and the source-drain region 5 in addition to the first embodiment illustrated in FIG. 3. With this, since the intrusion of hydrogen can be shielded in the vicinity of the E-type NMOS transistor 120 having the P-type gate electrode 7 by the metal silicide films 14 and 15 in addition to the hydrogen shielding metal or metallic film 10, the semiconductor device 100 according to the present embodiment is capable of further suppressing the occurrence of a malfunction due to hydrogen.

Incidentally, in the present embodiment, the metal silicide films 14 and 15 are formed of CoSi, but not limited thereto. For example, the metal silicide films may be formed of WSi, TiSi, NiSi or the like.

As described above, the semiconductor device according to the one embodiment of the present invention has the semiconductor substrate, the field-effect transistor which is arranged on the semiconductor substrate and used in the analog circuit and has the P-type gate electrode, the interlayer insulating film arranged on the field-effect transistor, and the hydrogen shielding metal or metallic film which is arranged on the interlayer insulating film and covering the P-type gate electrode and shields hydrogen.

In view of this, the semiconductor device according to the one embodiment of the present invention is capable of suppressing the occurrence of a malfunction due to hydrogen without increasing films to be formed.

Incidentally, in each embodiment described above, the D-type NMOS transistor 110 has the N-type gate electrode 6, and the E-type NMOS transistor 120 has the P-type gate electrode, respectively, but they are not limited thereto. The D-type NMOS transistor 110 may include the P-type gate electrode.

Further, in the present embodiment, both of the D-type NMOS transistor 110 and the E-type NMOS transistor 120 are constituted as the NMOS transistor, but are not limited thereto. Both of them may be constituted as the PMOS transistor.

Incidentally, in each embodiment described above, the analog circuit has been described as the ED type reference voltage generating circuit, but is not limited thereto. The analog circuit may include, for example, a non-ED type reference voltage generating circuit, a circuit in which the output of an ED type or non-ED type reference voltage generating circuit is connected to at least either of a non-inversion input terminal and an inversion input terminal of a comparator, a current mirror circuit, etc.

What is claimed is:
1. A semiconductor device comprising:
a semiconductor substrate;
a field-effect transistor arranged at least partially on the semiconductor substrate and used in an analog circuit, and having a P-type gate electrode;
an interlayer insulating film arranged on the field-effect transistor; and
a hydrogen shielding film arranged on the interlayer insulting film and covering the P-type gate electrode and configured to shield hydrogen, wherein the hydrogen shielding film comprises at least one of a metal film or a metallic film; and
a metal wiring arranged through the interlayer insulting film and electrically connecting at least the P-type gate electrode to the hydrogen shielding film.

2. The semiconductor device according to claim 1, wherein an area of the hydrogen shielding film is greater than that of the P-type gate electrode in at least an active region of the field-effect transistor as the semiconductor substrate is viewed in a plan view.

3. The semiconductor device according to claim 1, wherein a material of the hydrogen shielding film is an aluminum alloy.

4. The semiconductor device according to claim 2, wherein a material of the hydrogen shielding film is an aluminum alloy.

5. The semiconductor device according to claim 1, wherein the analog circuit is a reference voltage generating circuit.

6. The semiconductor device according to claim 2, wherein the analog circuit is a reference voltage generating circuit.

7. The semiconductor device according to claim 3, wherein the analog circuit is a reference voltage generating circuit.

8. The semiconductor device according to claim 4, wherein the analog circuit is a reference voltage generating circuit.

9. The semiconductor device according to claim 5, wherein the reference voltage generating circuit has a depletion type field-effect transistor configured to generate a constant current and an enhancement type field-effect transistor configured to generate a voltage, based on the constant current, and
wherein at least either of the depletion type field-effect transistor and the enhancement type field-effect transistor is a field-effect transistor having the P-type gate electrode.

10. The semiconductor device according to claim 6, wherein the reference voltage generating circuit has a depletion type field-effect transistor configured to generate a constant current and an enhancement type field-effect transistor configured to generate a voltage, based on the constant current, and
wherein at least either of the depletion type field-effect transistor and the enhancement type field-effect transistor is a field-effect transistor having the P-type gate electrode.

11. The semiconductor device according to claim 7, wherein the reference voltage generating circuit has a depletion type field-effect transistor configured to generate a constant current and an enhancement type field-effect transistor configured to generate a voltage, based on the constant current, and
wherein at least either of the depletion type field-effect transistor and the enhancement type field-effect transistor is a field-effect transistor having the P-type gate electrode.

12. The semiconductor device according to claim 8, wherein the reference voltage generating circuit has a depletion type field-effect transistor configured to generate a constant current and an enhancement type field-effect transistor configured to generate a voltage, based on the constant current, and
wherein at least either of the depletion type field-effect transistor and the enhancement type field-effect transistor is a field-effect transistor having the P-type gate electrode.

13. The semiconductor device according to claim 1, further including:
at least one additional field-effect transistor; and
a wide region hydrogen shielding film arranged above the hydrogen shielding film so as to cover the field-effect transistor and the at least one additional field-effect transistor as the semiconductor device is viewed in a plan view, wherein the wide region hydrogen shielding film comprises at least one of a metal film or a metallic film.

14. The semiconductor device according to claim 2, further including:
at least one additional field-effect transistor; and
a wide region hydrogen shielding film arranged above the hydrogen shielding film so as to cover the field-effect transistor and the at least one additional field-effect transistor as the semiconductor device is viewed in a plan view, wherein the wide region hydrogen shielding film comprises at least one of a metal film or a metallic film.

15. The semiconductor device according to claim 3, further including:
at least one additional field-effect transistor; and
a wide region hydrogen shielding film arranged above the hydrogen shielding film so as to cover the field-effect transistor and the at least one additional field-effect transistor as the semiconductor device is viewed in a plan view, wherein the wide region hydrogen shielding film comprises at least one of a metal film or a metallic film.

16. The semiconductor device according to claim 7, further including:
at least one additional field-effect transistor; and
a wide region hydrogen shielding film arranged above the hydrogen shielding film so as to cover the field-effect transistor and the at least one additional field-effect transistor as the semiconductor device is viewed in a plan view, wherein the wide region hydrogen shielding film comprises at least one of a metal film or a metallic film.

17. The semiconductor device according to claim 1, wherein a metal silicide film is formed above the P-type gate electrode.

18. The semiconductor device according to claim 2, wherein a metal silicide film is formed above the P-type gate electrode.

19. The semiconductor device according to claim 3, wherein a metal silicide film is formed above the P-type gate electrode.

20. A method of manufacturing a semiconductor device, comprising:
forming a field-effect transistor arranged at least partially on a semiconductor substrate and used in an analog circuit, and having a P-type gate electrode;
forming an interlayer insulating film on the field-effect transistor;
forming a metal wiring through the interlayer insulating film to electrically connect to at least the P-type gate electrode; and
forming a hydrogen shielding film shielding hydrogen on the interlayer insulting film and covering the P-type gate electrode and electrically connected to the metal wiring such that at least the P-type gate electrode is electrically connected to the hydrogen shielding film, wherein the hydrogen shielding film includes at least one of a metal film or a metallic film.

* * * * *